United States Patent
Kim et al.

(10) Patent No.: US 7,482,210 B2
(45) Date of Patent: Jan. 27, 2009

(54) METHOD OF FABRICATING SEMICONDUCTOR DEVICE HAVING JUNCTION ISOLATION INSULATING LAYER

(75) Inventors: Ji-young Kim, Kyungki-do (KR); Ki-nam Kim, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 11/370,454

(22) Filed: Mar. 7, 2006

(65) Prior Publication Data
US 2006/0160295 A1 Jul. 20, 2006

Related U.S. Application Data

(62) Division of application No. 10/452,034, filed on May 30, 2003, now Pat. No. 7,057,238.

(30) Foreign Application Priority Data
Jun. 12, 2002 (KR) ................ 2002-32974

(51) Int. Cl.
*H01L 21/84* (2006.01)
(52) U.S. Cl. .............. 438/151; 438/299; 438/301; 257/345; 257/327; 257/361
(58) Field of Classification Search ........ 257/345, 257/327, 372, 220, 361, 362, 394; 438/268, 438/269, 151, 270, 299, 301, 142, 149
See application file for complete search history.

(56) References Cited

U.S. PATENT DOCUMENTS

| 4,394,182 A | 7/1983 | Maddox, III |
| 4,885,618 A | 12/1989 | Schubert et al. |

(Continued)

FOREIGN PATENT DOCUMENTS

JP 09-045904 2/1997

(Continued)

OTHER PUBLICATIONS

English lauguage abstract of Korean Publication No. 10-0143713.

(Continued)

*Primary Examiner*—W. David Coleman
*Assistant Examiner*—Su C Kim
(74) *Attorney, Agent, or Firm*—Marger Johnson & McCollom, P.C.

(57) ABSTRACT

A semiconductor device and a method for fabricating the same are provided. The provided semiconductor device includes a field oxide layer formed in a semiconductor substrate to define an active region; gate structures formed on the active region; source/drain junctions formed on either side of the gate structures on the semiconductor substrate; a channel silicon layer arranged under the gate insulating layer to operate as a channel for connecting sources and drains; and buried junction isolation insulating layers under the channel silicon layer. The buried junction isolation insulating layers isolate source/drain junction regions of a MOS transistor, so that a short circuit in a bulk region under the channel of a transistor due to the high-integration of the device can be prevented.

17 Claims, 5 Drawing Sheets

U.S. PATENT DOCUMENTS

| | | | |
|---|---|---|---|
| 5,693,542 A * | 12/1997 | Suh et al. | 438/151 |
| 6,084,271 A | 7/2000 | Yu et al. | |
| 6,140,208 A * | 10/2000 | Agahi et al. | 438/437 |
| 6,198,141 B1 | 3/2001 | Yamazaki et al. | |
| 6,218,714 B1 | 4/2001 | Yamazaki | |
| 6,617,647 B2 | 9/2003 | Yamazaki | |
| 6,635,946 B2 * | 10/2003 | Lai et al. | 257/510 |
| 6,645,868 B1 * | 11/2003 | Babcock et al. | 438/703 |
| 6,670,260 B1 * | 12/2003 | Yu et al. | 438/526 |
| 2001/0005022 A1 * | 6/2001 | Ogura | 257/103 |
| 2003/0183901 A1 * | 10/2003 | Kanda et al. | 257/510 |

FOREIGN PATENT DOCUMENTS

KR    10-0143713    7/1998

OTHER PUBLICATIONS

English language abstract of Japanese Publication No. 09-045904.

* cited by examiner

METHOD OF FABRICATING SEMICONDUCTOR DEVICE HAVING JUNCTION ISOLATION INSULATING LAYER

CROSS REFERENCE TO RELATED APPLICATIONS

This application is a Divisional of U.S. patent application Ser. No. 10/452,034, filed May 30, 2003, issued as U.S. Pat. No. 7,057,238, which claims priority from Korean Patent Application No. 2002-32974, filed Jun. 12, 2002, which is incorporated by reference in its entirety.

BACKGROUND OF THE INVENTION

1. Field of the Invention

The present invention relates to semiconductor devices and a method for fabricating the same, and more particularly, to semiconductor devices having a structure where an epitaxial silicon layer is formed in an active region and sources and drains are formed in the epitaxial silicon layer and a fabricating method of the same.

2. Description of the Related Art

As semiconductor devices become more highly integrated, the design rule for the devices decreases. As a result, the areas allocated for forming semiconductor devices are also reduced, causing various problems in forming devices such as transistors. An NMOS transistor in a cell region having a memory device and PMOS and NMOS transistors in a peripheral region can secure electrical characteristics of transistors as long as a predetermined gate length is maintained in the transistors. When the devices are highly integrated, a short circuit can occur between source/drain junctions in a bulk region formed under channels, as well as a short channel effect, and the transistor devices may not operate properly.

To solve the above problems, various attempts have been made to increase the actual gate length of the transistor. One such attempt is a shallow junction method in which a shallow junction is formed to have a depth as shallow as possible.

However, as the devices have become more highly integrated and the design rule is extremely reduced, the distance between adjacent source and drain has become less than a critical value, even when the shallow junction method is used. When a thermal activation process, which is necessary during a junction formation process, is performed, impurity ions are diffused in a lateral direction. Consequently, junction areas are extended undesirably in the lateral direction. Accordingly, the distance between the sources and the drains becomes too narrow and source/drain junctions can be short-circuited.

SUMMARY OF THE INVENTION

The present invention provides a semiconductor device and a method for fabricating the same so as to attain excellent electrical characteristics of MOS transistor devices by efficiently preventing a junction short circuit between sources and drains in a bulk area even if a channel distance between the sources and drains is reduced due to the high integration of devices.

According to an aspect of the present invention, there is provided a semiconductor device comprising a field oxide layer formed on a semiconductor substrate to define an active region; gate structures formed on the active region by sequentially depositing a gate insulating layer and a gate conductive layer; source/drain junctions formed on either side of the gate structures in the semiconductor substrate; a channel silicon layer arranged under the gate insulating layer to operate as a channel for connecting sources and drains; and junction isolation buried insulating layers formed of, for example, an insulating layer containing silicon under the channel silicon layer to isolate the source/drain junctions.

Preferably, the channel silicon layer is an epitaxial silicon layer formed by a selective epitaxial growth (SEG) method. It is preferable that the upper portions of the source/drain junctions are formed in the epitaxial silicon layer that extends in the lateral direction in order to extend the distance between source and drain and form a shallow junction.

The junction isolation buried insulating layers are arranged substantially the central portions of the gate structures and formed in the shape of a trench which is formed by etching the semiconductor substrate to a predetermined depth. The junction isolation insulating layers form small patterns to form the insulating layers deep in the semiconductor substrate.

It is preferable that the buried insulating layer is formed by chemical vapor deposition (CVD) to reduce thermal budget on the semiconductor substrate.

It is preferable that the buried insulating layer is a silicon oxide layer formed by thermally oxidizing the semiconductor substrate of the semiconductor device in order to fill the narrow trenches without performing additional removing processes of insulating layers.

According to another aspect of the present invention, there is provided a method for fabricating a semiconductor device. In the method, a field oxide layer is formed in a semiconductor substrate to define an active region therein. A mask insulating layer having a junction isolation pattern is formed in the active region of the semiconductor substrate in which gate structures will be formed. Junction isolation trenches having a predetermined depth are formed in the semiconductor substrate using the junction isolation pattern as a mask to divide the active region. Thereafter, a filling insulating layer is formed in the junction isolation trenches to form junction isolation insulating layers. Then, the mask insulating layer. Preferably, mono-crystalline epitaxial silicon is grown on the semiconductor substrate in the active region to form an epitaxial silicon layer, and gate structures are formed in the active region having the epitaxial silicon layer. Sources and drains are formed on either side of the gate structures.

Preferably, the field oxide layer is formed to protrude from the surface of the semiconductor substrate to a predetermined height in order to perform as a mask pattern when selectively forming an epitaxial layer on the silicon substrate in the active region. In addition, the overgrowth over the field oxide layer can be prevented. Furthermore, the field oxide layer can be used as a polishing stopper when performing CVD after the overgrowth of epitaxial silicon.

Preferably, the mask insulating layer includes a buffer silicon oxide layer and a silicon nitride layer formed on the buffer silicon oxide layer. In this case, since the silicon substrate does not directly contact to the silicon nitride layer, defects of the silicon substrate are reduced.

The semiconductor substrate is preferably dry-etched to a predetermined depth, using the mask insulating layer on the semiconductor substrate as a mask, to form junction isolation trenches. Here, the surface of the semiconductor substrate is cleaned via a predetermined wet cleaning method. It is preferable that the semiconductor substrate is cleaned using a cleaning solution including hydrofluoric acid (HF) because the trench etching contaminates the semiconductor substrate due to polymers.

A trench-filling insulating layer is formed on the semiconductor substrate to fill the junction isolation trenches and the trench-filling insulating layer remains only in the junction isolation trenches in the semiconductor substrate. Here, the trench-filling insulating layer is planarized using a CMP method or a dry etch back method. It is preferable that the trench-filling insulating layer is one selected from a silicon oxide layer formed by CVD and a silicon nitride layer.

It is preferable that filling the junction isolation trenches is performed by oxidizing the semiconductor substrate in the junction isolation trenches using a predetermined oxidization method.

Exposing the semiconductor substrate in the active region includes removing the mask insulating layer using a predetermined etching method. More specifically, the silicon nitride layer is removed by wet etching using phosphoric acid ($H_3PO_4$). The oxide layer remaining on the semiconductor substrate is removed by using a cleaning solution including HF. Thus, the semiconductor substrate in the active region except for the field oxide layer and the junction isolation insulating layer is exposed.

When forming the epitaxial silicon layer on the active region, the semiconductor substrate in the active region is cleaned using $H_2SO_4$ or HCl solution to remove metal ions from the surface of the silicon substrate. By removing particles from the surface of the semiconductor substrate using a predetermined cleaning process, a clean epitaxial layer can be obtained not to generate defects when growing epitaxial silicon. Thereafter, a mono-crystalline epitaxial silicon layer is formed by performing CVD on the active region. Here, the epitaxial silicon layer is formed by performing a selective epitaxial growth (SEG) method using CVD. Accordingly, the epitaxial silicon layer is grown on the semiconductor substrate so that the epitaxial silicon layer formed only in the active region. The epitaxial layer is overgrown in lateral directions and extended to the field oxide layer. Therefore, the epitaxial layer having a predetermined thickness is formed on the active region.

Then, a gate insulating layer, a gate conductive layer, and a mask insulating layer are sequentially formed on the epitaxial silicon layer, and patterned to form a gate pattern. Insulating spacers are formed on the sidewalls of the gate pattern. The gate insulating layer is formed of one selected from a silicon oxide layer ($SiO_2$) and a silicon nitride layer (SiON). In addition, the mask insulating layer and the insulating spacers are formed of one selected from a silicon oxide layer and a silicon nitride layer formed by CVD.

Thereafter, impurity ions are implanted by using the gate structures as a mask, and the impurity ions are activated by using a predetermined thermal process to form source/drain junctions. Here, in the case of a PMOS transistor, P-type elements, such as boron (B) and boron fluoride ($BF_2$), are implanted as the impurity ions. In the case of an NMOS transistor, N-type elements, such as phosphorus (P), arsenic (As), and antimony (Sb), are implanted as the junction ions. It is preferable that a rapid thermal process is used to reduce needless thermal budget on the semiconductor substrate, in order to form shallow junctions.

In the semiconductor device according to the present invention, a junction isolation insulating layer is formed under a channel, which connects a source and a drain arranged under a gate of a MOS transistor. Thus, the junction isolation insulating layer isolates a source junction and a drain junction. As a result, even when the distance between the source junction and the drain junction is reduced due to the reduction of a line width of the device, a short circuit due to the lateral diffusion or junction expansion of the junctions can be prevented.

BRIEF DESCRIPTION OF THE DRAWINGS

The above aspects and advantages of the present invention will become more apparent through the following detailed description of preferred embodiments thereof made with reference to the attached drawings, in which.

DETAILED DESCRIPTION OF THE INVENTION

The present invention will now be described more fully with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

Figure 1:
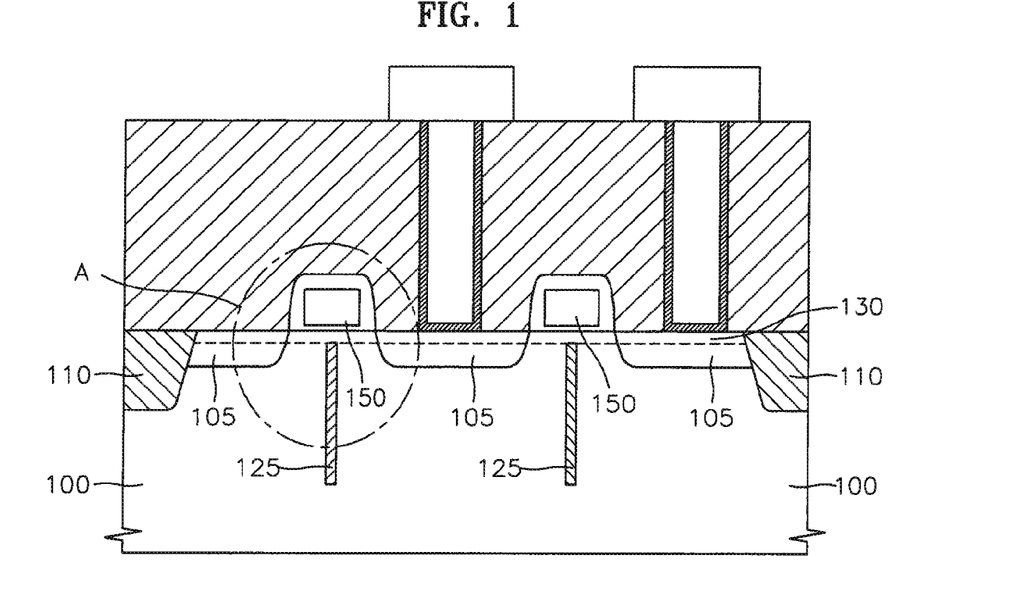
FIG. 1 is a cross-sectional view illustrating a semiconductor device according to one embodiment of the present invention.
Figure 2:
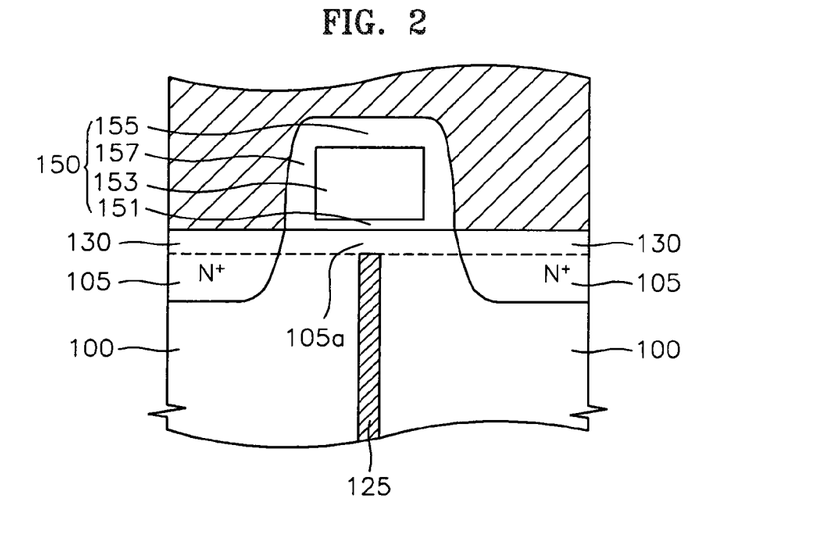
FIG. 2 is a partial cross-sectional view illustrating portion A of FIG. 1.

FIG. 1 is a cross-sectional view illustrating a semiconductor device according to a first embodiment of the present invention, and FIG. 2 is a cross-sectional view illustrating portion A of FIG. 1.

Referring to FIGS. 1 and 2, a field oxide layer 110 (a field region) is formed in a semiconductor substrate such as a silicon substrate 100 to define an active region therebetween. Gate structures 150 are formed on the active region. The gate structures 150 include a gate insulating layer 151, a gate conductive layer 153, and a mask insulating layer 155. Further, sidewall spacers such as insulating spacers 157 can be formed on the sidewalls of the gate structures 150. Also, junction isolation insulating layers 125 are formed under the gate structures 150 to isolate source regions from drain regions in the active region with respect to the gate structures 150.

Further, an epitaxial silicon layer 130 extends above the upper portion of the silicon substrate 100 in the active region and also above the junction isolation insulating layers 125. The epitaxial silicon layer 130 includes channel regions 105a of FIGS. 9 and 10. The source/drain junctions 105 are formed in the epitaxial silicon layer 130 and also in the silicon substrate 100. The source/drain junctions 105 are formed on either side of the gate structures 150.

The field oxide layer 110 is formed using conventional isolation techniques. In particular, if the design rule is extremely small due to the high integration of devices, a trench isolation method is preferred.

The junction isolation insulating layers 125 are buried in the silicon substrate 100 and are vertically arranged under the gate structures 150 in the active region to form a T-shape with the channel regions. The junction isolation insulating layer 125 are preferably below substantially the central region of the gate structures 150 and are formed of an insulating layer to isolate the source and drain junctions 105 in a lateral direction. The insulating layer may be formed by forming trenches in the silicon substrate 100 and filling the trenches with an insulating layer, e.g., an insulating layer containing silicon such as a silicon oxide layer or a silicon nitride layer, which is preferably formed by a chemical vapor deposition (CVD). Alternatively, the insulating layer may be formed by forming trenches and thermally oxidizing the silicon substrate 100 in the trenches to fill the trenches with a thermal oxidation layer.

The gate insulating layer 151 is formed of, for example, a thermally-grown silicon oxide layer ($SiO_2$) or oxynitirde (SiON). A person skilled in the art will appreciate other suitable gate dielectric material can also be used to form the gate insulating layer 151. The gate conductive layer 153 generally uses conductive polycrystalline silicon doped with impurities, such as phosphorus (P). In order to improve the conductivity of the gate structures 150, the gate conductive layer 153 may comprise a metal silicide layer (not shown). The mask insulating layer 155 or a hard mask layer comprise a silicon nitride layer or a silicon oxide layer formed by, for example, chemical vapor deposition (CVD). Preferably, the mask insulating layer 155 comprise a silicon nitride layer if a self-aligned contact (SAC) technique is used to form contacts.

The source and drain junctions 105 are formed by doping high-density P-type or N-type impurities into the epitaxial silicon layer 130 and the silicon substrate 100 to a predetermined depth. The source and drain junctions 105 are isolated by the junction isolation insulating layers 125 in the bulk area of the silicon substrate 100. Accordingly, even when a predetermined thermal process is performed, the junction isolation insulating layers 125 prevent undesirable lateral diffusion of the junctions 105. Therefore, when a potential difference is applied on the semiconductor device to operate the device, the junction isolation insulating layers 125 prevent diffusion of the junction areas in the lateral direction. Thus, the electrical characteristics of the transistor device can be maintained without the problems of the prior art.

FIGS. 3 through 9 are sectional views illustrating a method for fabricating a semiconductor device according to a first embodiment of the present invention.

Figure 3:
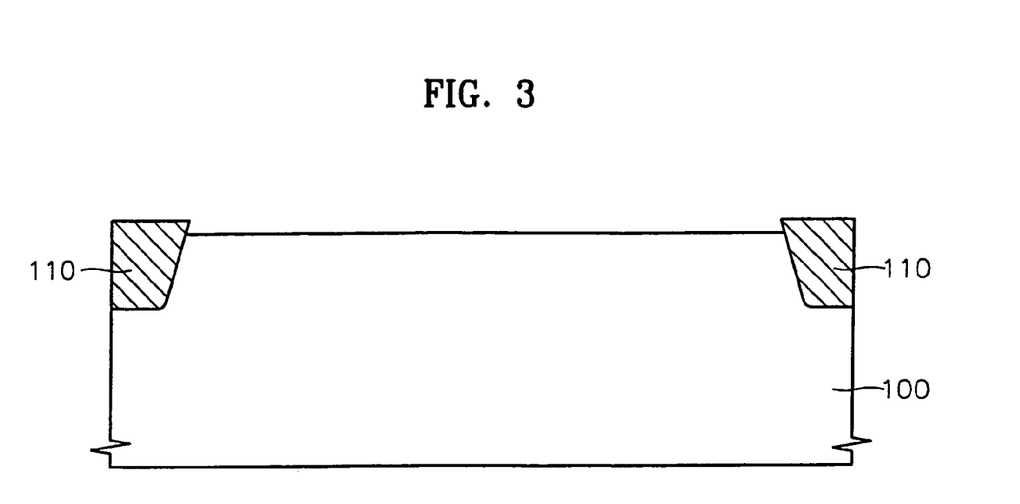
FIGS. 3 through 9 are cross-sectional views illustrating a method for fabricating a semiconductor device according to one embodiment of the present invention.

Referring to FIG. 3, a field oxide layer 110 (a field region) is formed in a silicon substrate 100 to define an active region. For example, trenches are formed in the silicon substrate 100 to form the field oxide layer 110. A filling insulating layer (not shown) is formed on the silicon substrate 100 to fill the trenches. The filling insulating layer is then planarized to leave the filling insulating layer in the trenches, thereby forming the field oxide layer 110. The filling insulating layer is formed of a silicon oxide layer, which is formed by, for example, CVD. Here, PE (plasma enhanced) CVD is used to improve the filling capability of the trenches. Preferably, a high-density plasma chemical vapor deposition (HDP-CVD), which allows for excellent layer deposition speed, is used to form the filling insulating layer. Here, it is preferable that the height of the field oxide layer 110 be greater than the height of the active region of the silicon substrate 100 so that the field oxide layer 110 can operate as a sidewall boundary mask when an epitaxial silicon layer is selectively formed in the active region.

The field oxide layer 110 can be formed by a local oxidation of silicon (LOCOS) method or an advanced LOCOS (A-LOCOS) method, instead of the conventional trench isolation method.

Figure 4:
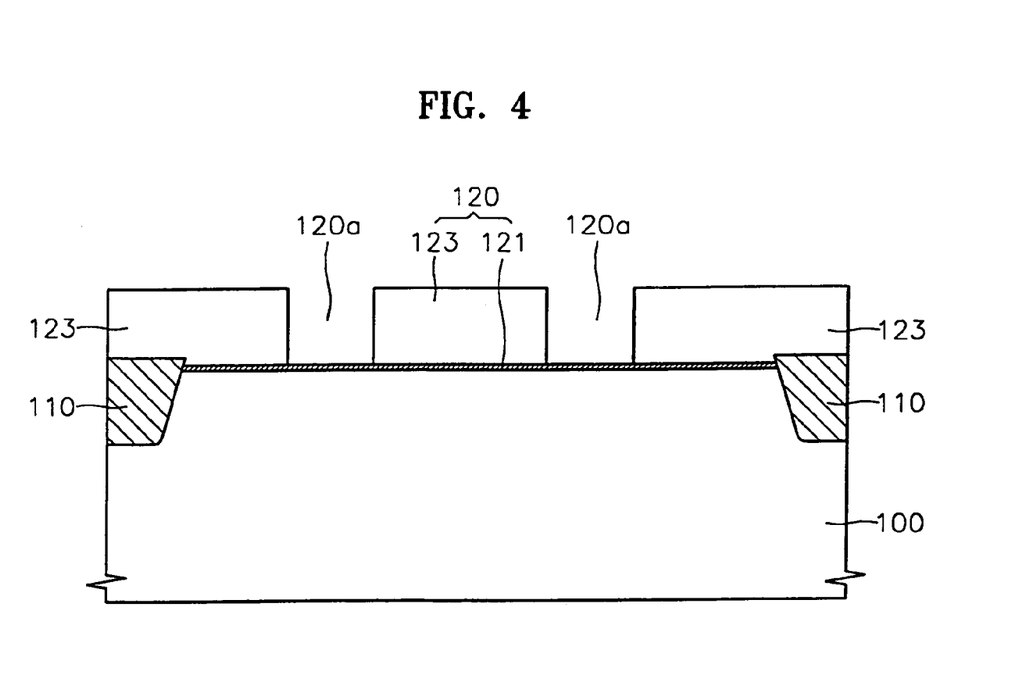

Referring to FIG. 4, a mask insulating layer pattern 120 including a junction isolation hole 120a is formed on the silicon substrate 100. To form the mask insulating layer pattern 120, first, a pad oxide layer 121 is formed on the silicon substrate 100, and a silicon nitride layer 123 is sequentially formed on the pad oxide layer 121. The pad oxide layer 121 is preferably formed by thermally oxidizing the silicon substrate 100. The silicon nitride layer 123 is generally formed by CVD such as low-pressure CVD (LP-CVD) to be used as a hard mask in a patterning process.

Thereafter, a photoresist (not shown) is coated on the resulting structure. A junction isolation pattern for dividing an active region is formed in the photoresist using photolithography. The mask insulating layer pattern 120 having the junction isolation hole 120a is then formed by etching the silicon nitride layer 123 using the patterned photoresist as a mask. If the trenches are etched using the mask insulating layer pattern 120 alone as a mask, the pad oxide layer 121 may also be etched to expose the silicon substrate 100. This helps to etch the trenches in a sequential process. However, if insulating spacers 124 are formed on the sidewalls of the mask insulating layer pattern 120, it is preferable that only the silicon nitride layer 123 is etched and the pad oxide layer 121 remains, as shown in FIG. 4, so as to prevent contamination of the silicon substrate 100 by the photoresist.

Figure 5:
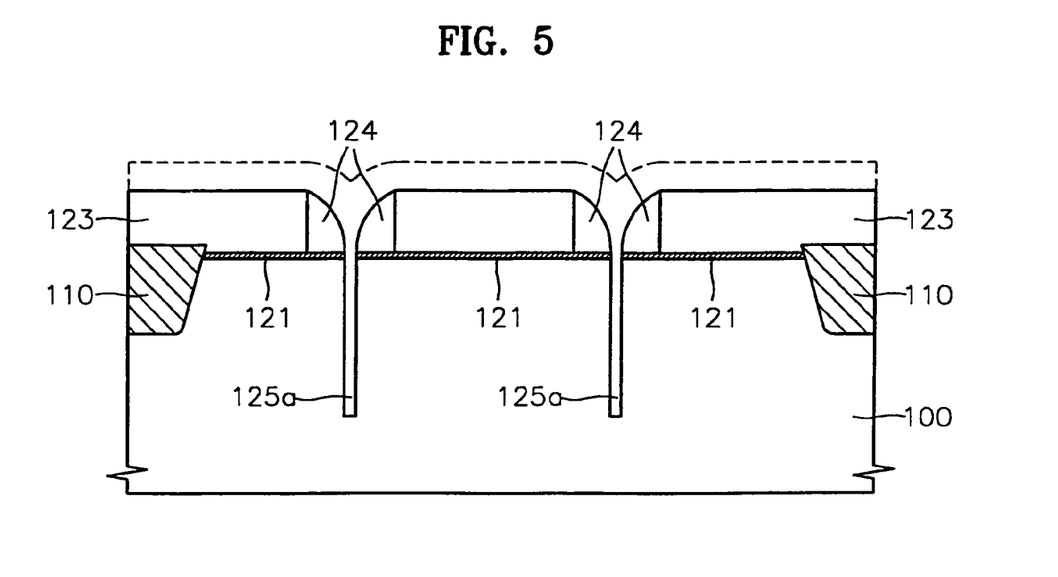

Referring to FIG. 5, a spacer insulating layer (not shown) is deposited on the surface of the silicon substrate 100. The spacer insulating layer can be formed of a dielectric material such as silicon nitride. The spacer insulating layer is then etched by an anisotropic dry etching method to form insulating spacers 124 on the sidewalls of the mask insulating layer pattern 120. Accordingly, a hole narrower than the junction isolation hole 120a (FIG. 4) in the mask insulating layer pattern 120 is formed.

The pad oxide layer 121 under the silicon nitride layer 123 is subsequently removed to expose the silicon substrate 100. Next, the substrate 100 is etched to a predetermined depth using the mask insulating layer pattern 120 including the insulating spacers 124 formed on the sidewalls thereof as an etching mask using dry etching. Accordingly, the silicon substrate 100 is caved in or etched to a predetermined depth to form junction isolation trenches 125a.

Thereafter, the surface of the silicon substrate 100, including the inside of the junction isolation trenches 125a, is cleaned using a cleaning solution including a hydrofluoric acid (HF) to remove polymer generated during the dry etching process. Therefore, the junction isolation trenches 125a are formed in the active regions to divide the active regions, as shown in FIG. 5. The depth of the junction isolation trenches 125a is deeper than the depth of source and drain junctions 105 (refer to FIG. 1) that will be formed in a subsequent process. For example, the depth of the junction isolation trenches 125a ranges from about 0.1 μm to about 0.5 μm.

Figure 6:
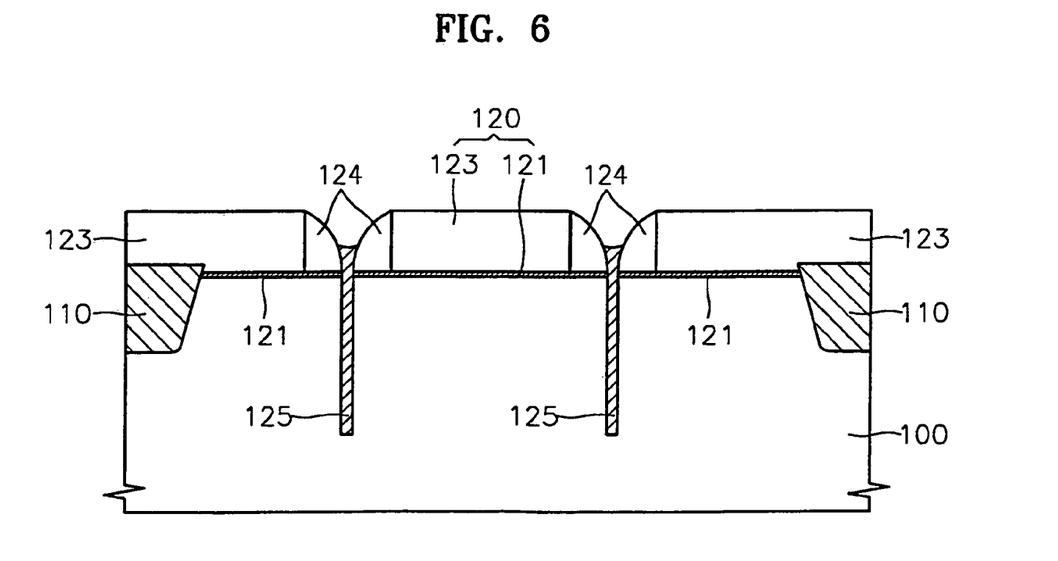

Referring to FIG. 6, a trench-filling insulating layer (not shown) is formed on the surface of the silicon substrate 100, and is planarized, leaving the trench-filling insulating layer inside of the junction isolation trenches 125a only. The trench-filling insulating layer may be a suitable insulating layer such as a silicon oxide layer formed by, for example, CVD. In the planarization process, the trench-filling insulating layer and the upper portion of the mask insulating layer pattern 120 are preferably removed by a dry etch-back or chemical mechanical polishing (CMP) process. Thus, the trench-filling insulating layer remains only in the junction isolation trenches 125a.

Alternatively, the trenches 125a can be filled with a silicon oxide layer by oxidizing the silicon substrate 100 in the junction isolation trenches 125a by performing a predetermined oxidation method such as a thermal oxidation method. A silicon source is exposed in the trenches 125a so that an oxidization reaction can occur to form a silicon oxide layer. However, the other surfaces are covered by the mask insulating layer pattern 120 so that oxidization reaction does not occur. As a result, the silicon oxide layer is selectively formed in the trenches 125a. In this case, a separate planarization process is not required, so the number of processes can be reduced, and the density of the trench filling oxide layer is high so that an etch rate to a wet cleaning solution is low. Thus, the original shape of the oxide layer can be maintained.

Figure 7:
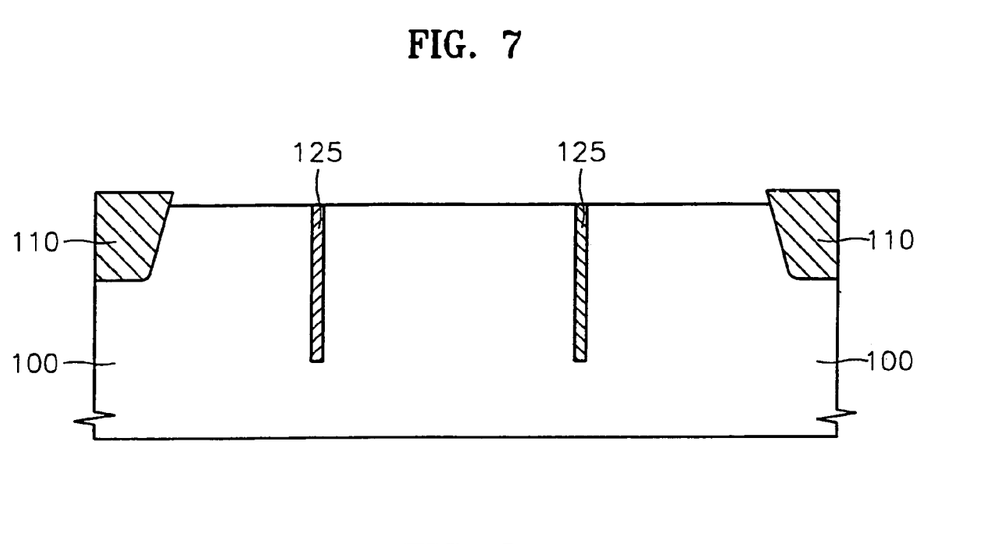

Referring to FIG. 7, the mask insulating layer pattern 120 is removed by dry etching or wet etching to expose the silicon substrate 100. Preferably, wet etching is used because a plasma generated during a dry etching process may cause damage to the silicon substrate 100. Here, during wet etching, a phosphoric acid solution ($H_3PO_4$) is used to remove the silicon nitride layer 123 of the mask insulating layer pattern 120, and an oxide layer etch solution including a hydrofluoric-acid (HF) solution is used to remove the pad oxide layer 121. During the etching process, a predetermined amount of the trench-filling insulating layer, which is exposed to the etch solution, is removed. Therefore, portions protruding from the silicon substrate 100 are removed, and the trench-filling insulating layer remains in the trenches, completing the formation of the junction isolation insulating layers 125. The height of the field oxide layer 110 is preferably higher than that of the silicon substrate 100 in the active region so that the field oxide layer 110 can be used as a mask in a selective epitaxial growth process.

Figure 8:
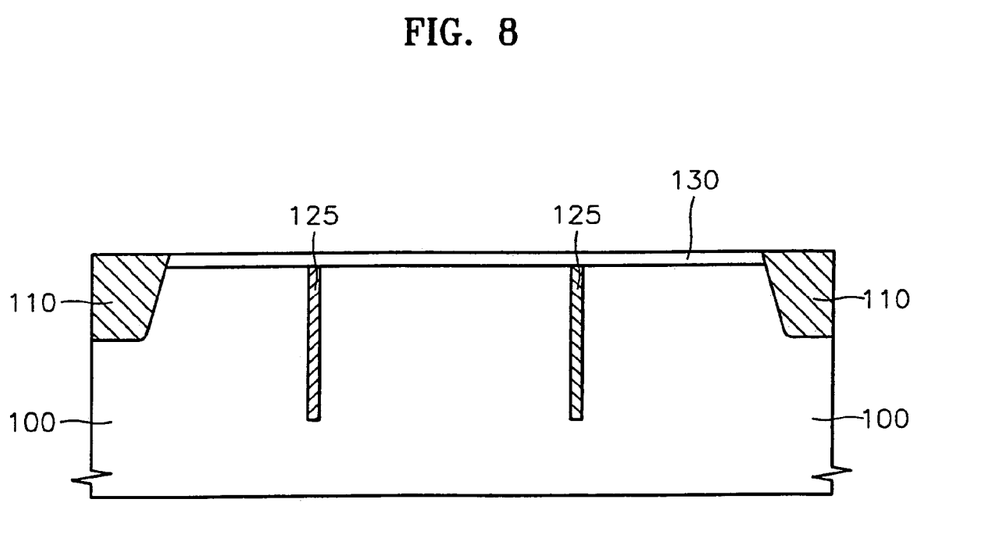

Referring to FIG. 8, an epitaxial silicon layer 130 is formed in the active region using the silicon substrate 100 exposed in the active region as a silicon source, by a selective epitaxial Growth (SEG) method using CVD. The SEG method uses a gas such as DCS ($SiH_2Cl_2$), TCS ($SiHCl_3$), silicon chloride ($SiCl_4$), and silicon hydride ($SiH_4$), as a silicon source gas. In particular, a hydrochloric acid (HCl) gas may be added to selectively deposit silicon so as to not grow silicon on the insulating layer containing silicon. In addition, hydrogen ($H_2$) that does not have particles and that does not generate side reactions to grow mono-crystalline silicon on the silicon substrate 100 is used as a carrier gas.

Accordingly, mono-crystalline epitaxial silicon is grown in lateral and vertical directions using the silicon substrate 100 as a source, and the epitaxial silicon layer 130 is formed extended from an adjacent active region over the upper portion of the junction isolation insulating layers 125 in the active region by an epitaxial overgrowth. Consequently, an epitaxial silicon layer 130 having a predetermined thickness is formed on the active region of the silicon substrate 100 and on the junction isolation insulating layers 125. The height of the epitaxial silicon layer 130 is higher than that of the field oxide layer 110 and is planarized by CMP. The epitaxial silicon layer 130 is formed to a thickness for forming channels between the source/drain junctions 105 (refer to FIG. 1) under the gate structures 150.

Figure 9:
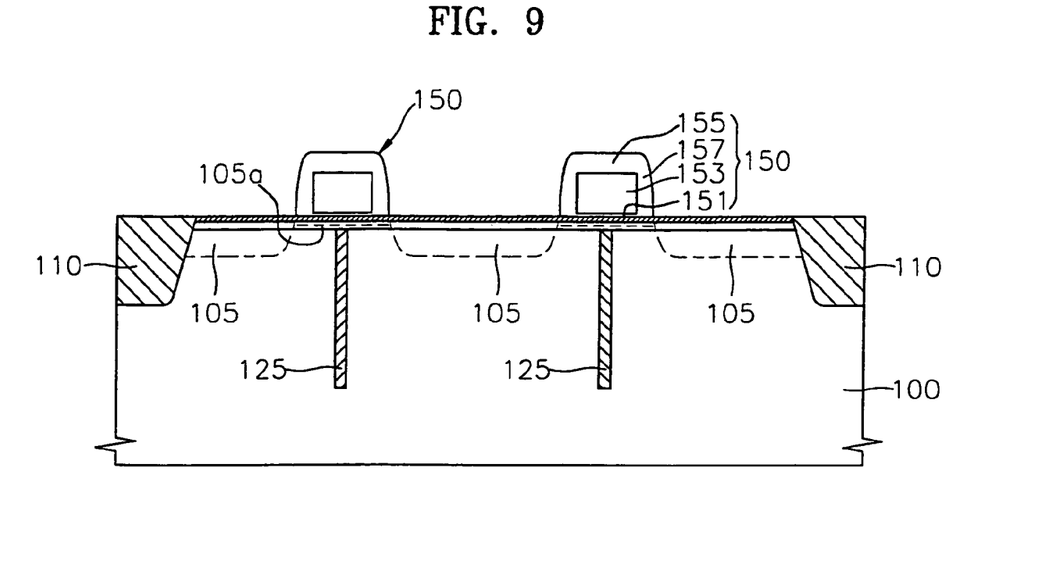

Referring to FIG. 9, gate structures 150 are formed on the active region in the silicon substrate 100 including the epitaxial silicon layer 130, and source/drain junctions 105 also are formed.

That is, a gate insulating layer 151, a gate conductive layer 153, and a hard mask layer 155 are sequentially formed on the epitaxial silicon layer 130 in the active region. By performing predetermined photo/dry etching processes, a gate pattern is transcribed to the hard mask layer 155 and the gate conductive layer 153. Thereafter, insulating spacers 157 are formed on the sidewalls of the gate pattern to complete the gate structures 150.

Impurity ions are implanted into the sides of the gate structures 150 using the gate structures 150 as a mask, and a predetermined thermal process is performed to activate impurity ions that were implanted into the gate structures 150, forming the source/drain junctions 105. Here, in the case of a PMOS transistor, P-type elements, such as boron (B) and boron fluoride ($BF_2$), are implanted as the impurity ions. In the case of an NMOS transistor, N-type elements, such as phosphorus (P), arsenic (As), and antimony (Sb), are implanted as the junction ions. It is preferable that a rapid thermal process is used to reduce needless thermal budget on the semiconductor substrate, in order to form shallow junctions.

Thereafter, capacitors and bit lines are formed, a metalization process is performed to form a semiconductor device such as a memory device, and predetermined planarization and metalization processes are performed to form a logic device having a multi-layered metal.

As described above, junction isolation insulating layers 125 for physically separating source/drain junctions 105 are formed in a semiconductor device according to the present invention except in channel regions 105a under the gate structures 150. Therefore, the junction isolation insulating layers 125 prevent a short circuit from occurring between the source/drain junctions 105 due to the expansion or later diffusion of the source/drain junctions 105 during a thermal process. Consequently, the threshold voltage of a MOS transistor is maintained. In addition, the source/drain junctions 105 are separated or isolated from each other so that a junction formation error can be prevented, even if the device is highly integrated.

Figure 10:
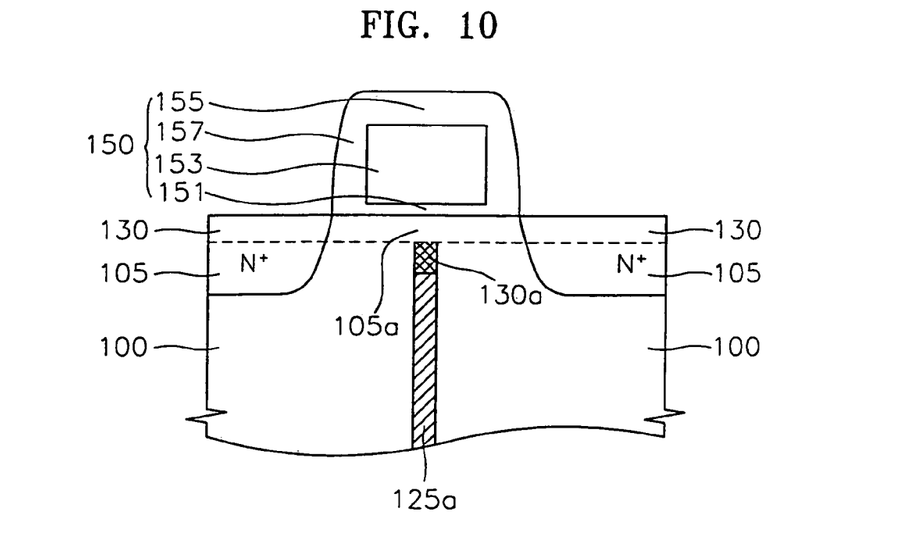
FIG. 10 is a sectional view illustrating a semiconductor device according to another embodiment of the present invention.

FIG. 10 is a sectional view illustrating a semiconductor device according to a second embodiment of the present invention.

Referring to FIG. 10, junction isolation trenches 125a buried to a predetermined depth are not completely filled with an insulating material. In addition to the insulating material, the junction isolation trenches 125a are also filled with an epitaxial silicon layer 130. Accordingly, when the epitaxial silicon is grown, the epitaxial silicon at the sidewalls of the junction isolation trenches 125a is grown at the same time so that polysilicon 130a is grown in the junction isolation trenches 125a and the epitaxial silicon is grown at portions contacting the silicon substrate 100. Therefore, the characteristics of the epitaxial silicon layer 130 in channel regions 105a are improved, thereby improving the electrical characteristics of the semiconductor device.

A semiconductor device and a method for fabricating the same according to the present invention provides the following advantages.

A semiconductor device according to the present invention completely isolates source/drain junction regions from a bulk region, except for channel regions under gate structures, so that a short circuit due to the expansion of the junctions can be prevented.

In addition, the channel regions are formed of an epitaxial silicon layer so that electrical characteristics are improved, i.e., the threshold voltage of a transistor becomes stable.

While this invention has been particularly shown and described with reference to. preferred embodiments thereof, it will be understood by those skilled in the art that various changes in form and details may be made therein without departing from the spirit and scope of the invention as defined by the appended claims.

What is claimed:

1. A method for fabricating a semiconductor device, the method comprising:
   (a) forming a field oxide layer in a semiconductor substrate to define an active region therein;
   (b) forming a mask insulating layer pattern having a junction isolation hole on the semiconductor substrate;
   (c) forming junction isolation trenches having a predetermined depth in the semiconductor substrate using the junction isolation pattern as a mask;
   (d) forming a filling insulating layer in the junction isolation trenches to form a junction isolation insulating layer;
   (e) removing the mask insulating layer pattern to expose the active region;
   (f) growing epitaxial silicon on the active region to form an epitaxial silicon layer on the active region including the junction isolation insulating layer where the epitaxial silicon layer has a mono-crystalline structure;
   (g) forming gate structures on the epitaxial silicon layer; and
   (h) forming sources and drains on either side of the gate structures in the active region.

2. The method of claim 1, wherein the field oxide layer protrudes from the surface of the semiconductor substrate to a predetermined height during (f).

3. The method of claim 1, wherein (b) further includes:
   forming a mask insulating layer on the semiconductor substrate;
   forming a patterned photoresist on the mask insulating layer; and
   forming a junction isolation hole in the mask insulating layer by etching the mask insulating layer, using the patterned photoresist as a mask, to form the mask insulating layer pattern.

4. The method of claim 3, wherein the mask insulating layer includes a buffer silicon oxide layer and a silicon nitride layer formed on the buffer silicon oxide layer.

5. The method of claim 3, further comprising forming insulating spacers on sidewalls of the mask insulating layer pattern.

6. The method of claim 1, wherein (c) further includes:
   dry etching the semiconductor substrate to a predetermined depth using the mask insulating layer pattern as an etch mask, to form the junction isolation trenches; and
   cleaning the surface of the semiconductor substrate via a predetermined wet cleaning method.

7. The method of claim 1, wherein (d) further includes:
   forming a trench-filling insulating layer on the semiconductor substrate to fill the junction isolation trenches; and
   planarizing the trench-filling insulating layer, leaving the trench-filling insulating layer only in the junction isolation trenches in the semiconductor substrate.

8. The method of claim 6, wherein the trench-filling insulating layer is one selected from a silicon oxide layer formed by CVD and a silicon nitride layer.

9. The method of claim 1, wherein filling the junction isolation trenches in (d) is performed by oxidizing the semiconductor substrate in the junction isolation trenches using an oxidization method.

10. The method of claim 1, wherein the mask insulating layer pattern comprises a silicon nitride layer and a pad oxide layer formed below the silicon nitride layer, and (e) removing the mask insulating layer pattern and exposing the semiconductor substrate of the active region, further includes:
    removing the silicon nitride layer using a predetermined etching method; and
    removing the pad oxide layer remaining on the semiconductor substrate.

11. The method of claim 1, wherein (f) further includes:
    exposing the semiconductor substrate on the active region; and
    forming a mono-crystalline epitaxial silicon layer on the active region.

12. The method of claim 11, wherein the epitaxial silicon layer is formed by a selective epitaxial growth (SEG) method.

13. The method of claim 11, wherein the epitaxial silicon layer is formed By CVD.

14. The method of claim 1, wherein (g) further includes:
    sequentially forming a gate insulating layer, a gate conductive layer, and a hard mask layer on the epitaxial silicon layer;
    patterning the hard mask layer and the gate conductive layer; and
    forming sidewall spacers on sidewalls of the patterned hard mask layer and the patterned gate conductive layer.

15. The method of claim 1, wherein (h) further includes:
    implanting impurity ions using the gate structures as a mask; and
    activating the impurity ions by using a predetermined thermal process to form source/drain junctions.

16. The method of claim 1, wherein (d) further includes forming a trench-filling insulating layer on the semiconductor substrate to fill the junction isolation trenches before (e).

17. The method of claim 1, wherein (f) further includes filling a top portion of the junction isolation trench with the epitaxial silicon layer.

* * * * *

UNITED STATES PATENT AND TRADEMARK OFFICE
CERTIFICATE OF CORRECTION

PATENT NO. : 7,482,210 B2　　　　　　　　　　　　　　　　　　　　Page 1 of 1
APPLICATION NO. : 11/370454
DATED : January 27, 2009
INVENTOR(S) : Ji-young Kim et al.

It is certified that error appears in the above-identified patent and that said Letters Patent is hereby corrected as shown below:

Column 10, line 29, the word "By" should read -- by --.

Signed and Sealed this

First Day of December, 2009

David J. Kappos
*Director of the United States Patent and Trademark Office*